United States Patent [19]

Suzuki et al.

[11] Patent Number: 5,705,871
[45] Date of Patent: Jan. 6, 1998

[54] PULSE GENERATOR HAVING INDEX ANGLES FORMED BY PERMANENT MAGNET ROTOR

[75] Inventors: Yuzuru Suzuki, Shizuoka-ken; Sakae Fujitani, Hamakita; Kenichi Makino, Shizuoka-ken, all of Japan

[73] Assignee: Minebea Co., Ltd., Nagano-ken, Japan

[21] Appl. No.: 751,815

[22] Filed: Nov. 19, 1996

[30] Foreign Application Priority Data

Dec. 28, 1995 [JP] Japan ................... 7-352205

[51] Int. Cl.⁶ .................. H02K 11/00; H02K 21/12
[52] U.S. Cl. ................... 310/156; 310/68 B; 310/193; 310/254
[58] Field of Search .................. 310/156, 49 R, 310/68 B, 254, 268, 185, 193; 318/560, 561, 603, 138

[56] References Cited

U.S. PATENT DOCUMENTS

| 4,755,701 | 7/1988 | Shikama | 310/156 |
| 4,785,242 | 11/1988 | Baidya et al. | 324/208 |
| 4,866,381 | 9/1989 | Tatsuhiko | 324/208 |
| 5,109,193 | 4/1992 | Pike | 324/207.1 |
| 5,334,894 | 8/1994 | Nakagawa | 310/49 R |
| 5,408,153 | 4/1995 | Imai et al. | 310/68 B |
| 5,410,201 | 4/1995 | Tamaka et al. | 310/68 B |

FOREIGN PATENT DOCUMENTS

| 63-117278 | 7/1988 | Japan . |
| 63-191873 | 12/1988 | Japan . |
| 1-146782 | 10/1989 | Japan . |
| 2-60449 | 2/1990 | Japan . |
| 2-89253 | 3/1990 | Japan . |
| 3-128652 | 5/1991 | Japan . |

Primary Examiner—Steven L. Stephan
Assistant Examiner—Tran N Nguyen
Attorney, Agent, or Firm—Frishauf, Holtz, Goodman, Langer & Chick

[57] ABSTRACT

A pulse generator includes a rotor assembly which is formed by circularly arranged magnetic poles, and a stator assembly which is disposed coaxial with the rotor assembly and is formed by stator coils arranged circularly. Index angles defined by the circumferential ends of the magnetic poles are made unequal to each other. Pitches defined by angular intervals between adjacent stator coils are selected to allow the stator coils to electromagnetically match the corresponding magnet poles only once per revolution of the rotor assembly.

11 Claims, 14 Drawing Sheets

TIME-TOTAL GENERATED
EMF OUTPUT CHARACTERISTIC

PULSE GENERATOR HAVING INDEX ANGLES FORMED BY PERMANENT MAGNET ROTOR

BACKGROUND OF THE INVENTION

1. Field of the Invention

The present invention relates to a pulse generator of a general type, and particularly to a pulse generator for outputting an effective electric signal only once during one revolution of a rotor assembly, and more particularly to an index generator which can be used to detect the angular position of the spindle motor of a VTR, an FDD or the like.

2. Description of the Related An

An index signal is used to ensure the interchangeability between 3.5-inch FDD media, for example. This index signal is generated by a spindle motor and is output once per revolution so that it is used to accurately determine the absolute angular position of the rotary object to be detected. The signal is generally detected in a non-contact state in order to maintain its reliability. Specifically, a magnet for generating an index signal is provided on a portion of the to-be-detected rotary object, and a magnetoelectric converter such as a sensor using a Hall element (a Hall sensor) is used to detect the absolute angular position of the to-be-detected rotary object.

However, a Hall sensor has the following problems:

(1) the Hall sensor itself is expensive;

(2) the Hall sensor is small-sized, and therefore it is difficult to be precisely mounted on an electric circuit board;

(3) Since a required current must continue to flow through the Hall sensor in order to obtain a required output therefrom, the sensor does not operate efficiently;

(4) the Hall sensor is a semiconductor element in which the temperature characteristics changes considerably and thus cannot be used in a wide range of temperatures; and (5) the Hall sensor cannot withstand a high electric stress and/or a high mechanical stress.

Further, an FG (frequency generator) is also a pulse generator. However, it produces a plurality of alternating voltages per revolution and thus fundamentally differs from the index signal pulse generator for generating index signals used to detect an absolute angular position of a rotary object.

SUMMARY OF THE INVENTION

The object of the present invention is to provide, at low cost, a pulse generator which generates a highly reliable index signal in a wide temperature range, which is assembled with high accuracy, which withstands high electric and mechanical stresses, and which performs energy conversion at high efficiency, without using a magnetoelectric converter such as a Hall sensor.

In order to achieve the object, the present invention provides a pulse generator comprising a rotor assembly and a stator assembly disposed coaxial with the rotor assembly. The rotor assembly comprises a permanent magnet which is formed by a plurality of magnetic poles arranged circularly with the center of the rotor assembly as its center. Each pair of the adjacent magnetic poles have magnetic polarities opposite to each other. Both circumferential ends of each magnetic pole define an index angle whose apex is on the center of the rotor assembly. The index angles of the magnetic poles are selected to be unequal to each other. A plurality of stator coils are arranged circularly at the center of the rotor assembly to form the stator assembly, wherein each stator coil is directed toward the permanent magnet. Pitches which are defined by angular intervals between all pairs of the central axes of the adjacent stator coils are selected so as to electromagnetically match their corresponding magnetic poles only once per revolution of the rotor assembly. Therefore, an EMF output which is generated only at one position where the magnetic poles and the stator assembly magnetically match per revolution of the pulse generator is definitely higher than the generated EMF outputs at the other positions, with the result that the pulse generator accurately generates one high-level index signal per revolution.

DETAILED DESCRIPTION OF THE PREFERRED EMBODIMENTS

A pulse generator of the present invention will now be described by way of a first embodiment with reference to FIGS. 1 to 7, a second embodiment with reference to FIGS. 8 to 15, a third embodiment with reference to FIG. 16, a fourth embodiment with reference to FIG. 17, and a filth embodiment with reference to FIG. 18.

Figure 1:
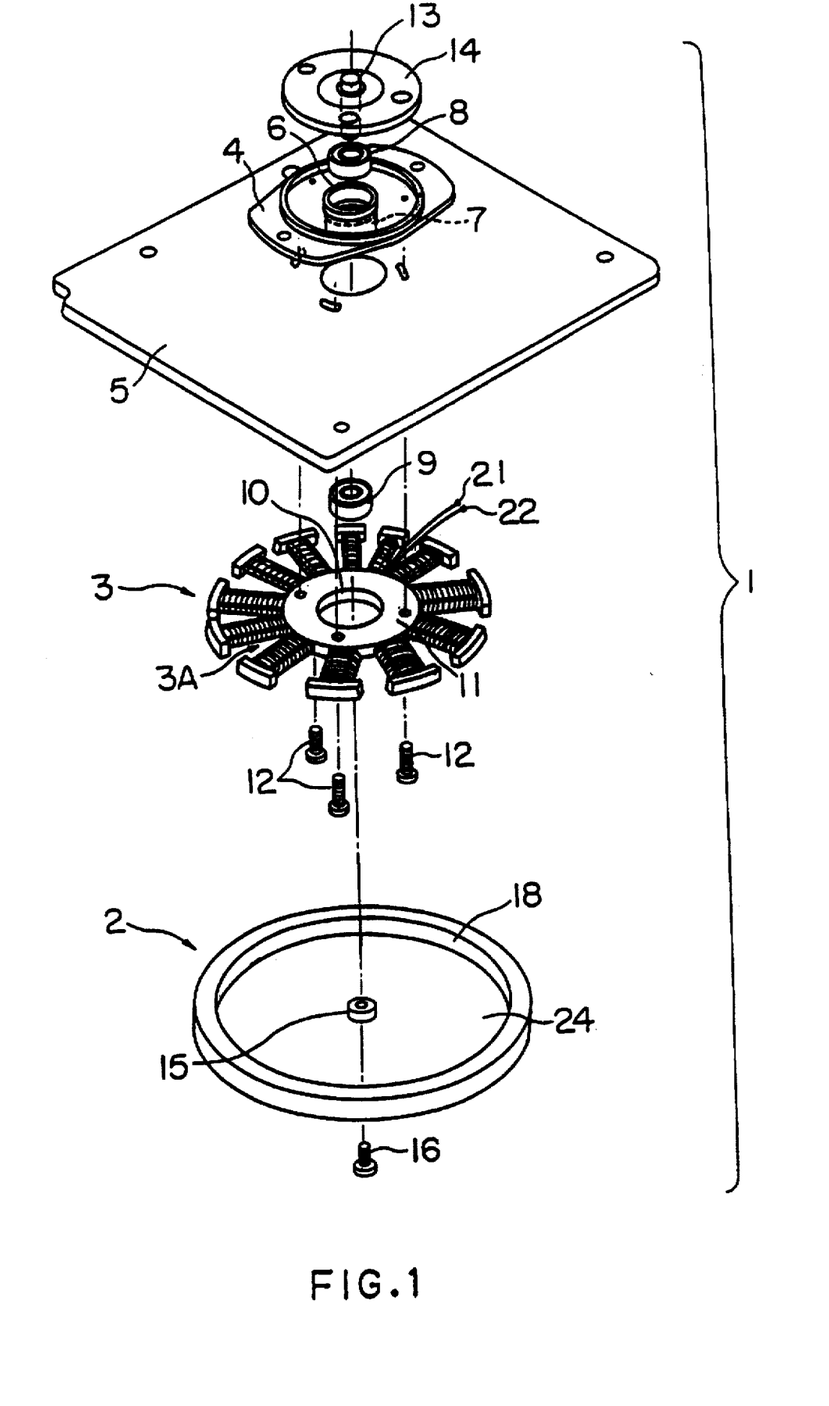
FIG. 1 is an exploded perspective view of a pulse generator according to a first embodiment of the present invention.

Referring to FIG. 1, a pulse generator 1 which is the first embodiment of the present invention includes a rotor assembly 2 comprising a shallow circular dish-shaped rotor cover 24 and a ring-shaped permanent magnet 18, and a substantially disk-like stator assembly 3 coaxial with the rotor assembly 2. A homing 4, which is cut and formed from aluminum material, is mounted on the stator assembly 3, with a flange plate 5 interposed therebetween. Radial ball bearings 8 and 9 are respectively fitted in holes formed in central boss portions 6 and 7 of the housing 4. The lower boss portion 7 extends through the flange plate 5.

The stator assembly 3 comprises a stator yoke 3A which has a disk-shaped central portion 11 with a central hole 10. The stator assembly 3 is fixed at the central portion 11 to the flange plate 5 and the housing 4 by means of fixing bolts 12. A rotary shaft 13 is fixed to a coupling 14 by press-fitting, for example, and extends through the ball bearings 8 and 9. By means of a fixing bolt 16 the rotary shaft 13 is also fastened to the rotor assembly 2 at a boss portion 15 formed on the central portion of the rotor assembly 2. The coupling 14 is connected to the external driving source of a rotary object such as a motor whose rotation is to be detected by the pulse generator 1. In the pulse generator 1, the coupling 14 is rotated in accordance with the rotation of the to-be-detected rotary object so that the rotor assembly 2 is rotated coaxially with the stator assembly 3 as the rotary shaft 13 rotates.

Figure 2:
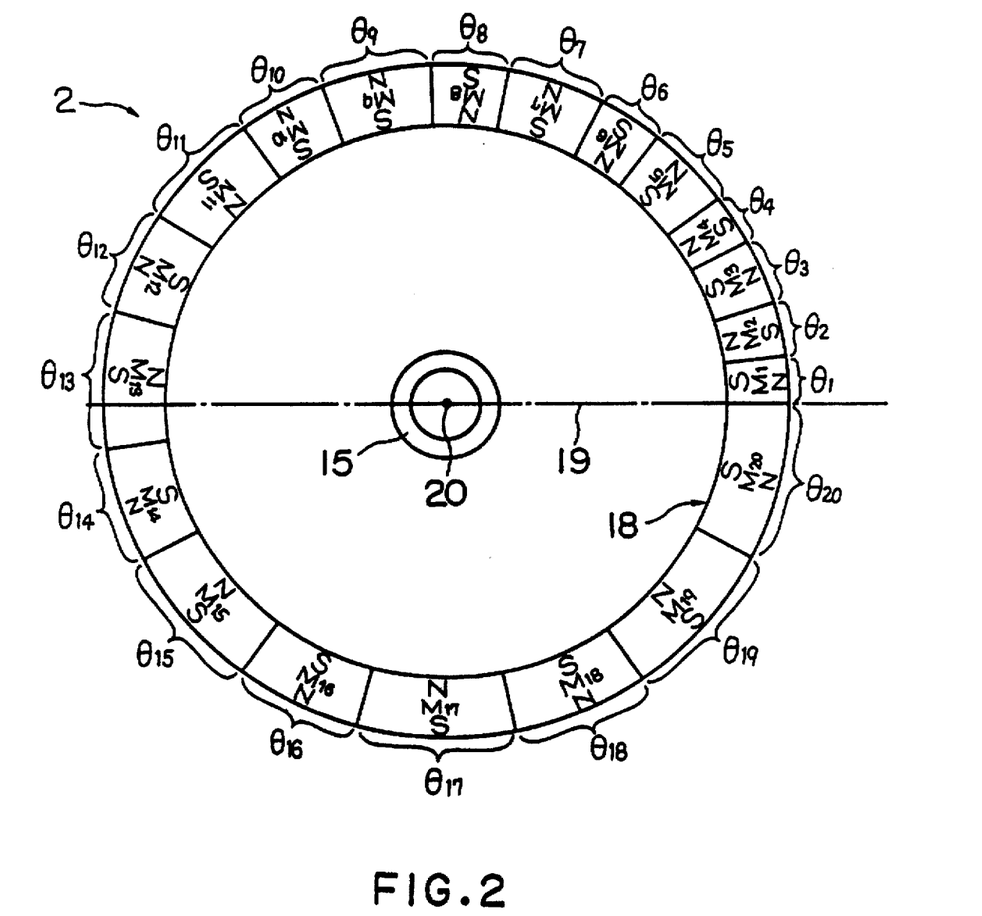
FIG. 2 is a plan view of the rotor assembly shown in FIG. 1.

As shown in FIGS. 1 and 2, a plurality of magnetic poles M are arranged circularly to form the permanent magnet 18. Each magnetic pole M has a first side and a second side opposite to the first side. The first sides of all magnetic poles M define the substantially circular outer edge of the permanent magnet 18 and the second sides of all magnet poles M define the substantially circular inner edge of the permanent magnet 18. The magnetic poles M are arranged such that the magnetic polarities of the first sides of each adjacent pair of the magnetic poles M opposite to each other, and the magnetic polarities of the second sides of each pair of the adjacent magnetic poles M are opposite to each other. In the first embodiment, twenty magnetic poles M1, M2, M3, . . . , M20 counted from an angle reference line 19 are arranged in a counterclockwise direction, and the index angles each defined by the circumferential opposite ends of each magnetic pole M at the center 20 of the rotor assembly 2 are shown as θ1, θ2, θ3, . . . , θ19 and θ20 which are also counted from the angle reference line 19. However, the number of magnetic poles is not limited to twenty but can be determined as follows. Here, the number of magnetic poles M will be represented by a generalized number n.

In this case, the index angles θ1, θ2, . . . , θk, . . . θn of the magnetic poles M1, M2, . . . Mk, . . . Mn have values different from each other. In particular, in the first embodiment, the values of the index angles θ are selected in the order of arithmetic progression. Specifically, when the index angle θ1 is taken to be β° as the first term of the arithmetic progression, the index angle θk of the k-th magnetic pole Mk is $\{\beta+(k-1)\delta\}$, provided that a common difference is δ°. When it is assumed that the index angle θn of the last magnetic pole Mn be $\{\beta+(n-1)\delta\}$, the sum Sn of θ1 to θn is $\{2\beta+(n-1)\delta\}n/2$.

The sum Sn is not always exactly 360° but some small difference may occur from 360°, depending on how to select the values of be β and δ of the formula. When the maximum difference is $\pm\epsilon°(\epsilon>0)$, the following relationship is obtained:

$$360-\epsilon \leq Sn \leq 360+\epsilon \qquad (1)$$

In other words, Sn is equal or close to 360. In particular, in order to prevent the pulse generator from producing an error signal, it is preferred that the index angle θn of the n-th magnetic pole Mn be selected to be unequal to the index angles of the other magnetic poles. To this end, it is preferred that ε be equal to δ/2. In this case, the following relationship is obtained:

$$360-\delta/2 \leq Sn \leq 360+\delta/2 \qquad (2)$$

When the present invention was made, δ° was 0.10° to 1.5° depending on the machining accuracy of that time. However, the value of δ is not limited to this range, and a narrower range is applicable as far as a higher machine accuracy can be attained. For example, when the number n of magnetic poles is twenty and θ° and δ° are 8° and 1.05°, respectively, Sn is equal to 359.50°, which is 0.5° smaller than 360°. The difference 0.5° is less than δ°/2=0.525°, and thus not only formula (1) but also formula (2) is satisfied.

Figure 3:
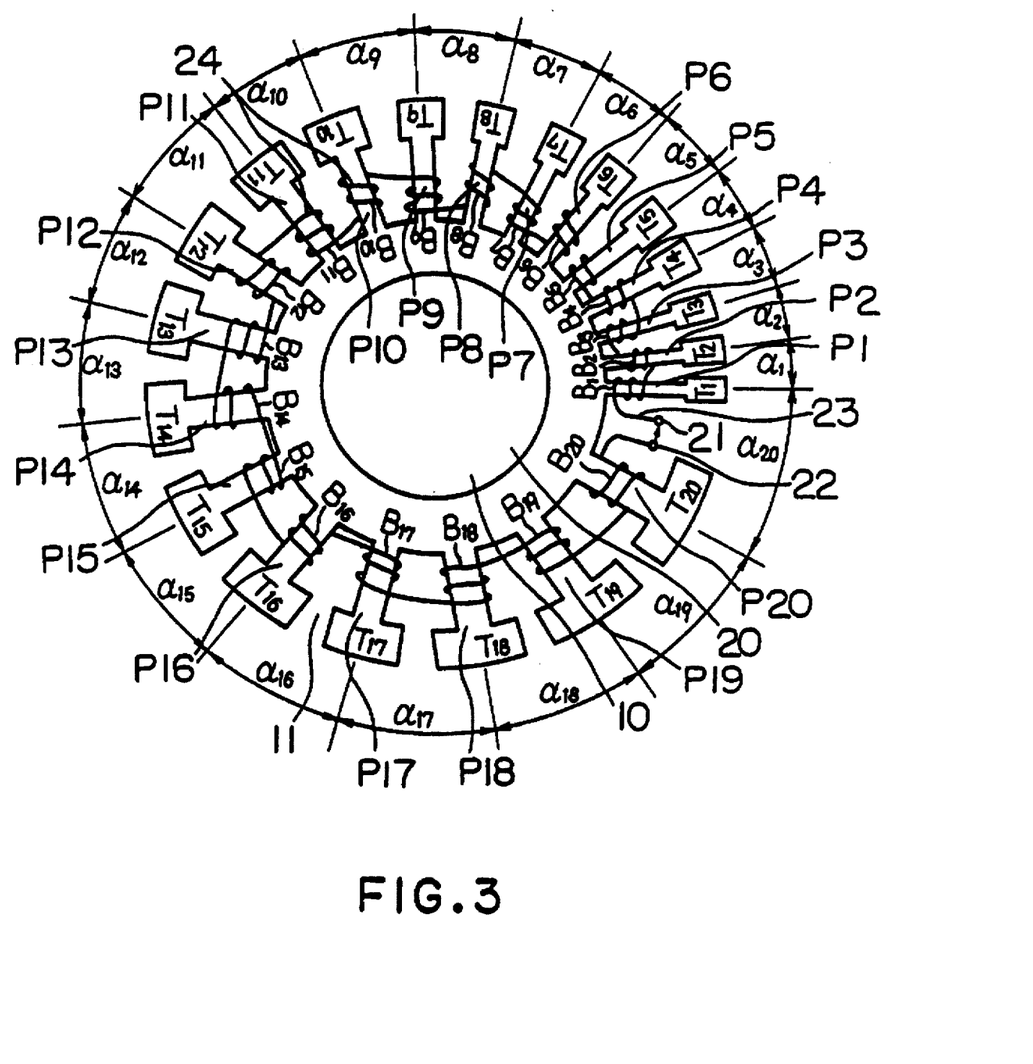
FIG. 3 is a plan view of the stator assembly shown in FIG. 1.

The stator yoke 3A is formed by stacking one on another a plurality of punched-out magnetic steel plates and has stator projections P which radially extend outward from the outer periphery of the central portion 11 and which are spaced circumferentially, as shown in FIG. 3. The number of stator projections P in the first embodiment is equal to the number N (in twenty in this embodiment as described above) of the magnetic poles M of the rotor assembly 2. In FIG. 3, the stator projections P shown by P1, P2, P3, . . . , Pn-1, Pn are arranged counterclockwise (the last projection in the first embodiment being P20). Here, only twelve stator projections are shown in FIG. 1 in order to prevent the drawings from being complicated.

A polyurethane-coated copper wire 23 extends from an input terminal 21 located on the clockwise side of the first stator projection P1 to an output terminal 22 located on the counterclockwise side of the last stator projection Pn, i.e., P20, and the intermediate portion of the wire 23 is wound around the stator projections P sequentially from the first stator projection P1 to the last stator projection Pn (P20), thus forming stator coils B, the number of which is n (twenty in FIG. 3). In FIG. 3, the stator coils B1, B2, - - - , B20 are arranged counterclockwise, the winding direction of the odd-numbered stator coils are opposite to the winding direction of the even-numbered stator coils. Stator salient poles T are formed in the distal ends of the respective stator projections P. The salient poles T are arranged in the counterclockwise direction in the order of T1, T2 - - - , T20.

The outer peripheral surfaces of the stator salient poles T form a circular surface separated from the circular inner surface of the assembly by a predetermined interval.

In FIGS. 3 and 4 to 6, angular intervals α1, α2, - - -, α20 (hereinafter referred to as "pitches") between the adjacent stator projections P are indicated in the counterclockwise direction. In this case, the last pitch is αn when the number of the stator projections P. They are equal to the index angles θ1, θ2, - - -, θ20 (generally, n). The stator yoke 3A thus constructed is coaxially disposed in the rotor assembly 2 in FIG. 2. Here, α20 or αn is the pitch between the last stator coil B20 or Bn and the first stator coil B1.

Figure 4:
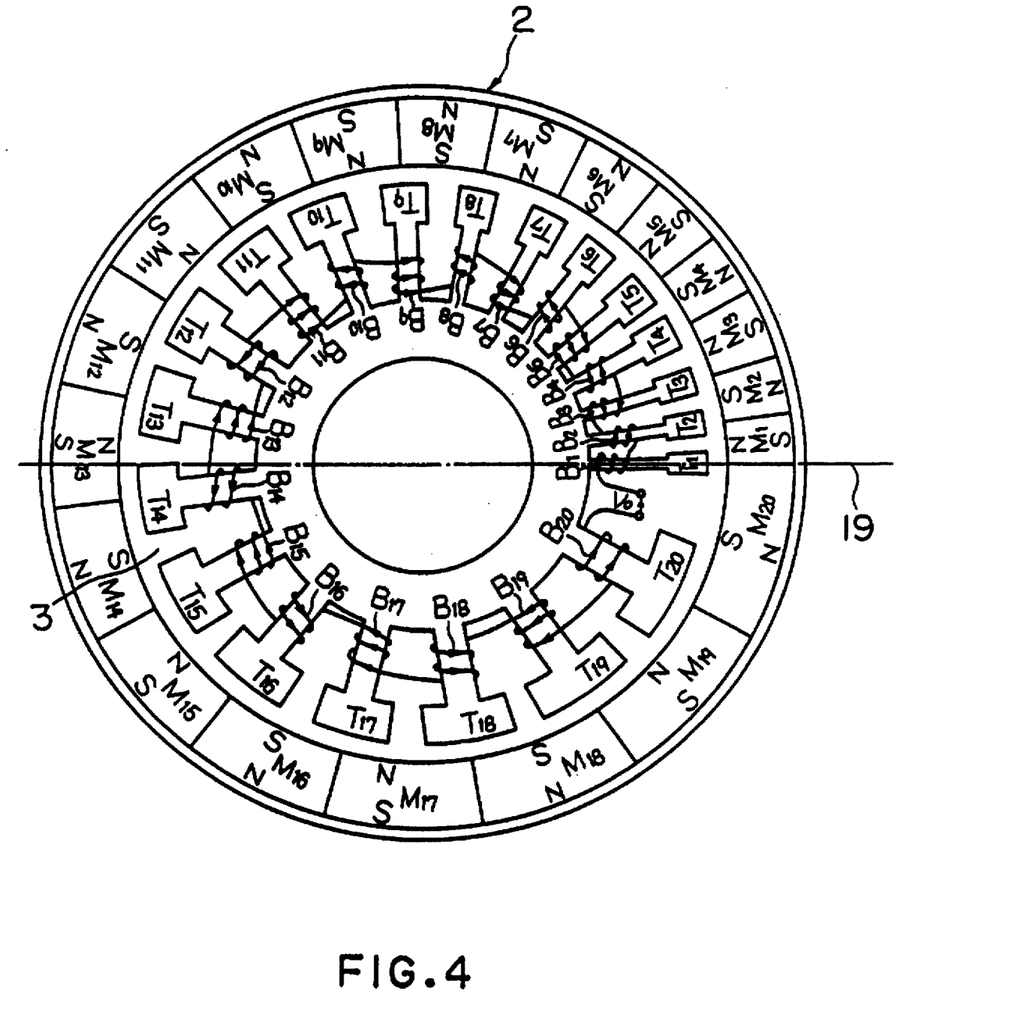
FIG. 4 is a plan view of the pulse generator of FIG. 1 when the rotor assembly exactly magnetically matches the stator assembly.
Figure 7:
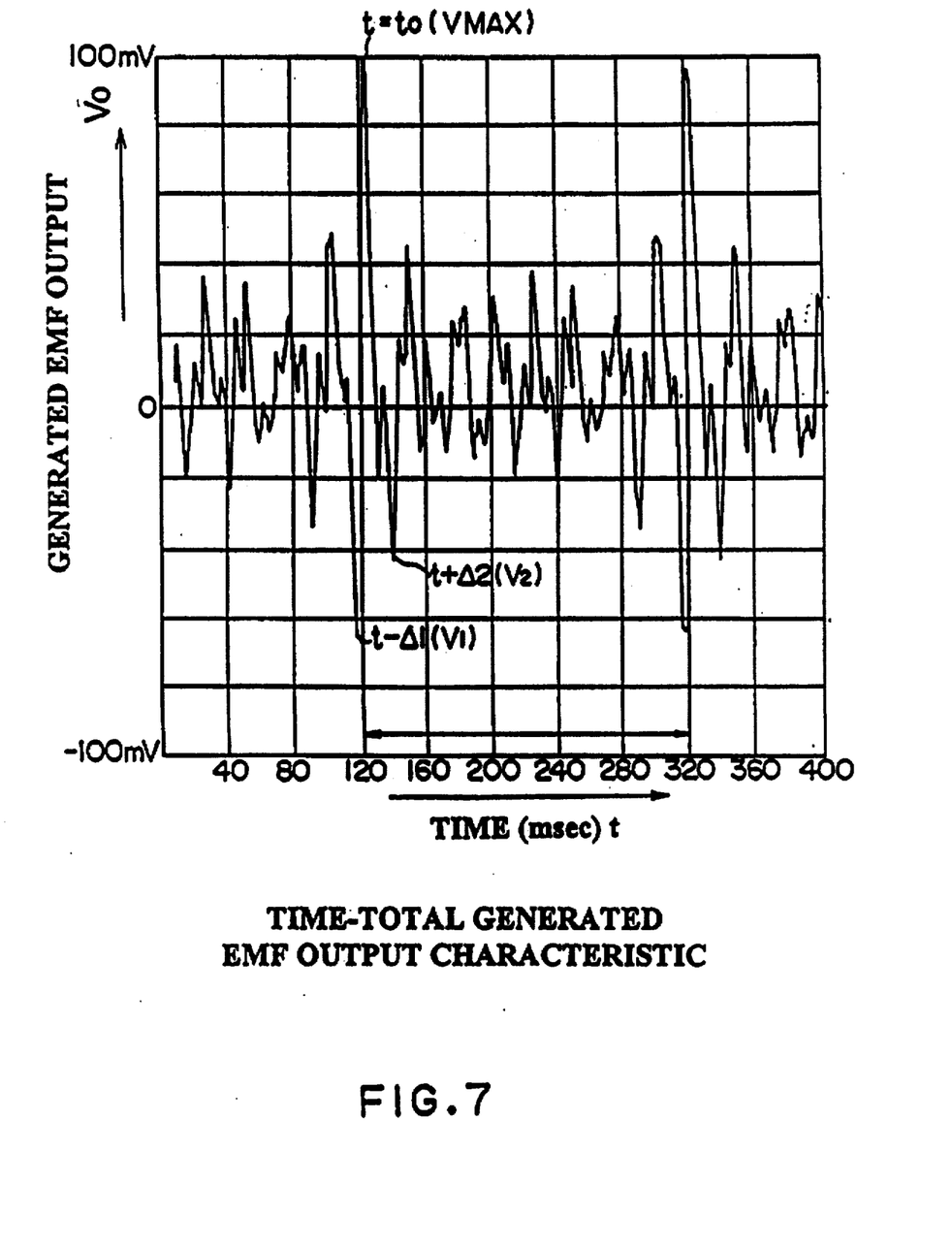
FIG. 7 is a graph showing the time—total output characteristic of the pulse generator as shown in FIG. 1.

Now let it be assumed that the rotation of a to-be-detected rotary object such as a VTR (a video tape recorder) or an FDD (a floppy disc drive) is transmitted to and rotates the rotor assembly 2 clockwise through the coupling 14. At time t=0 when the centers of the salient poles T1, T2, - - -, Tk, - - -, T20 match the counterclockwise sides of the magnetic poles M1, M2, - - -, Mk, - - -, M20 of the stator assembly 3 as shown in FIG. 4 while the rotor assembly 2 is being rotating, the magnetic poles M magnetically match the corresponding stator coils B better than in any other states. Under this condition, positive induced voltages generated by the corresponding magnetic poles in the corresponding wires are added, and the maximum total induced voltage VO=Vmax (for example, +100 mV) is produced between th input terminal 21 and the output terminal 22 of the pulled-out portion at the time t=t0, as shown in FIG. 7. In FIG. 4 and the subsequent figures, arrows in the coils indicate the directions of the induced voltages.

Figure 5:
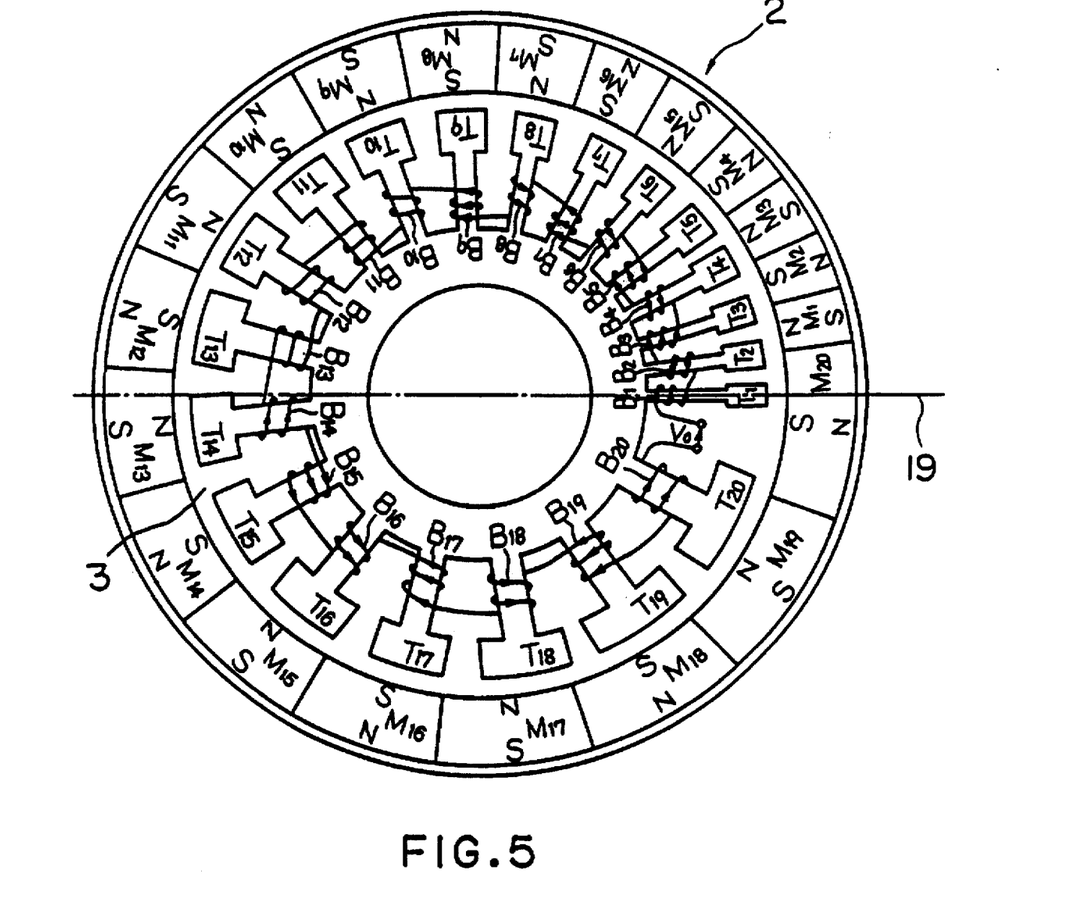
FIG. 5 is a plan view of the pulse generator of FIG. 1 at the time when the maximum negative total generated EMF output is obtained and which is earlier by a very short period than the time when the rotor assembly and the stator assembly have the positional relationship as shown in FIG. 4.
Figure 6:
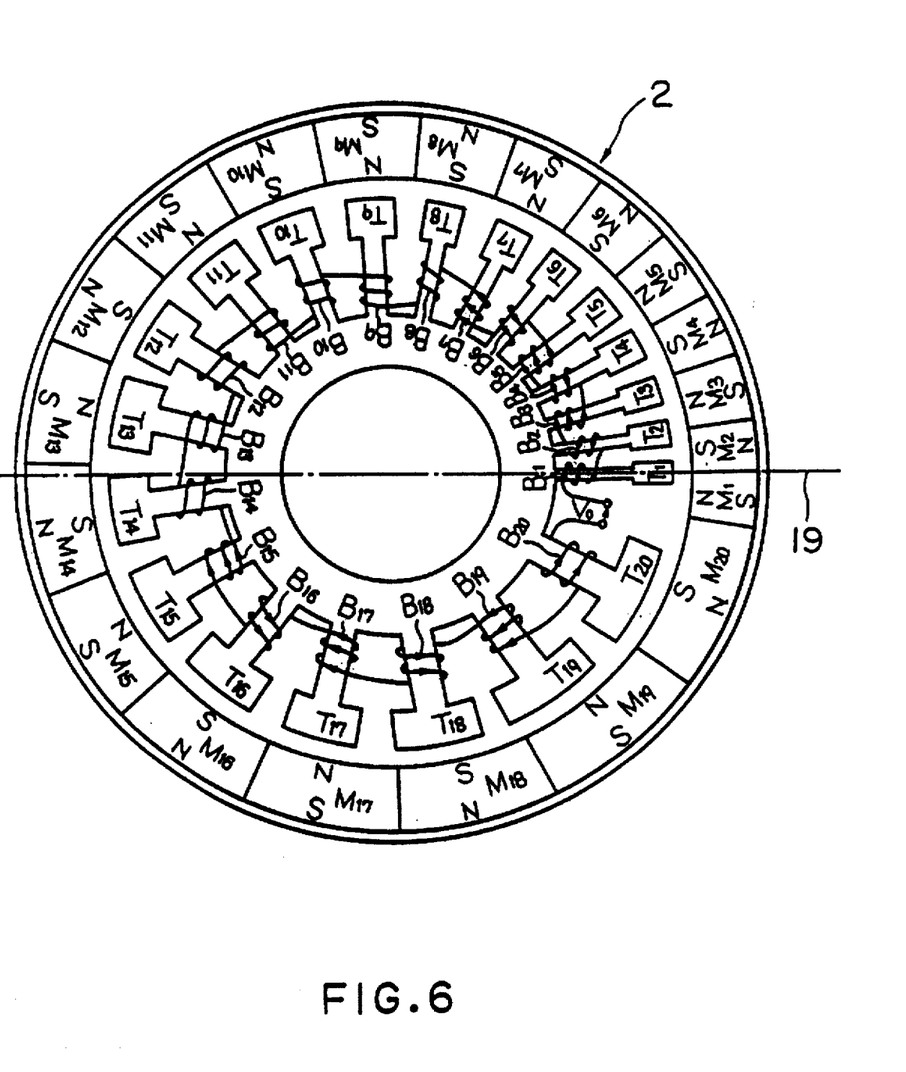
FIG. 6 is a plan view of the pulse generator of FIG. 1 at the time when the maximum negative total generated EMF output is obtained and which is later by a very short period than the time when the rotor assembly and the stator assembly have the positional relationship as shown in FIG. 4.

FIG. 5 show that the rotor assembly 2 is at time t=t0−Δ1 (Δ1 being a short positive period of time in several milliseconds, for example), in which induced voltages whose directions are reverse to those of the induced voltages in FIG. 6 (i.e., at t=t0) are generated in nine stator coils B1 to B9 and induced voltages whose directions are the same as those of the induced voltages in FIG. 6 are produced in the stator coils B14 to B20. However, very few induced electromotive forces are generated in the four stator coils B10 to B13. As a result, a negative total induced electromotive force (a total generated EMF output) VO=V1 (for example, −65 mV), the absolute value of which is much smaller than Vmax, is generated between the input terminal 21 and the output terminal 22 at time t=t0−Δ1, as shown in FIG. 7.

At time t=t0+Δ2 (Δ2 being a very short positive period of time, e.g. several milliseconds) when the positional relationship shown in FIG. 6 is attained between the rotor assembly 2 and the stator assembly 3, a total induced electromotive force whose direction is opposite to that at time t=t0 is generated in the seven stator coils B1 to B7, and a total induced electromotive force (total generated EMF output) whose direction is the same as that at time t=t0 is generated in the seven stator coils B8 to B14. However, very few induced electromotive forces are generated in the six stator coils B15 to B20. Consequently, a negative total induced electromotive force (total generated EMF output) VO=V2 (for example, −30 to about −35 mV), the absolute value of which is smaller than Vmax and than V1, is generated between the input terminal 21 and the output terminal 22 at time t=t0+Δ2, as shown in FIG. 7. It follows that the total induced electromotive force (the total generated EMF output) VO is remarkably large at time t=t0 throughout one cycle of revolution. In other words, the induced electromotive force generated in each of the stator coils B is maximum only when the rotor assembly 2 and the stator assembly 3 are located in the position at time t=t0, and therefore the total induced electromotive force is maximum only at this position.

As time t elapses, the total induced electromotive force (total generated EMF output) VO tends to decrease while the rotor assembly 2 is accurately rotated once from the matching state shown in FIG. 4, which tendency can be observed from the time—total generated EMF output characteristic in FIG. 7. The characteristic is accurately repeated as the rotor assembly 2 continues to rotate. Therefore, only when the magnetic poles M and the coils B magnetically and completely match once per revolution of the rotary assembly 2, as shown in FIG. 4, the total induced electromotive force VO, which is considerably higher than in the other states, is obtained, ensuring accurate detection of the rotational position of a to-be-detected rotary object such as an external driving power source. Thus, in this embodiment, a high positive voltage is generated once per revolution of the rotor assembly 2. The high-EMF generating position does not vary per revolution insofar as the electromagnetic relationship of the generator is unchanged, and therefore the absolute angular position of the to-be-detected rotary object can be determined. According to the latest techniques for electronic circuits, it is very easy to select the positive peak value of a generated EMF output waveform such as in the case of this embodiment.

According to the pulse generator 1 of the first embodiment, an accurate index signal can be obtained only at one position per revolution by making the pitches of the coils of the stator assembly 3 unequal to each other, and by selecting the index angles of the magnetic poles M of the rotor assembly 2 in accordance with the coil pitches as mentioned above. Moreover, the pulse generator of this embodiment is manufactured at a low cost because it is unnecessary to use an expensive magnetoelectric converter such as a Hall sensor in which an electric current must flow continuously during its operation. Further, this pulse generator has an excellent temperature characteristic, and thus can be used in a wide temperature range. Furthermore, it withstands high electric and mechanical stresses, and therefore can be used under severe environments.

FIGS. 8 to 15 show the pulse generator of the second embodiment which also has a rotor portion for driving a motor. In these drawings, the pulse generator is shown in an upside down state in contrast to the case shown in FIG. 1.

Figure 8:
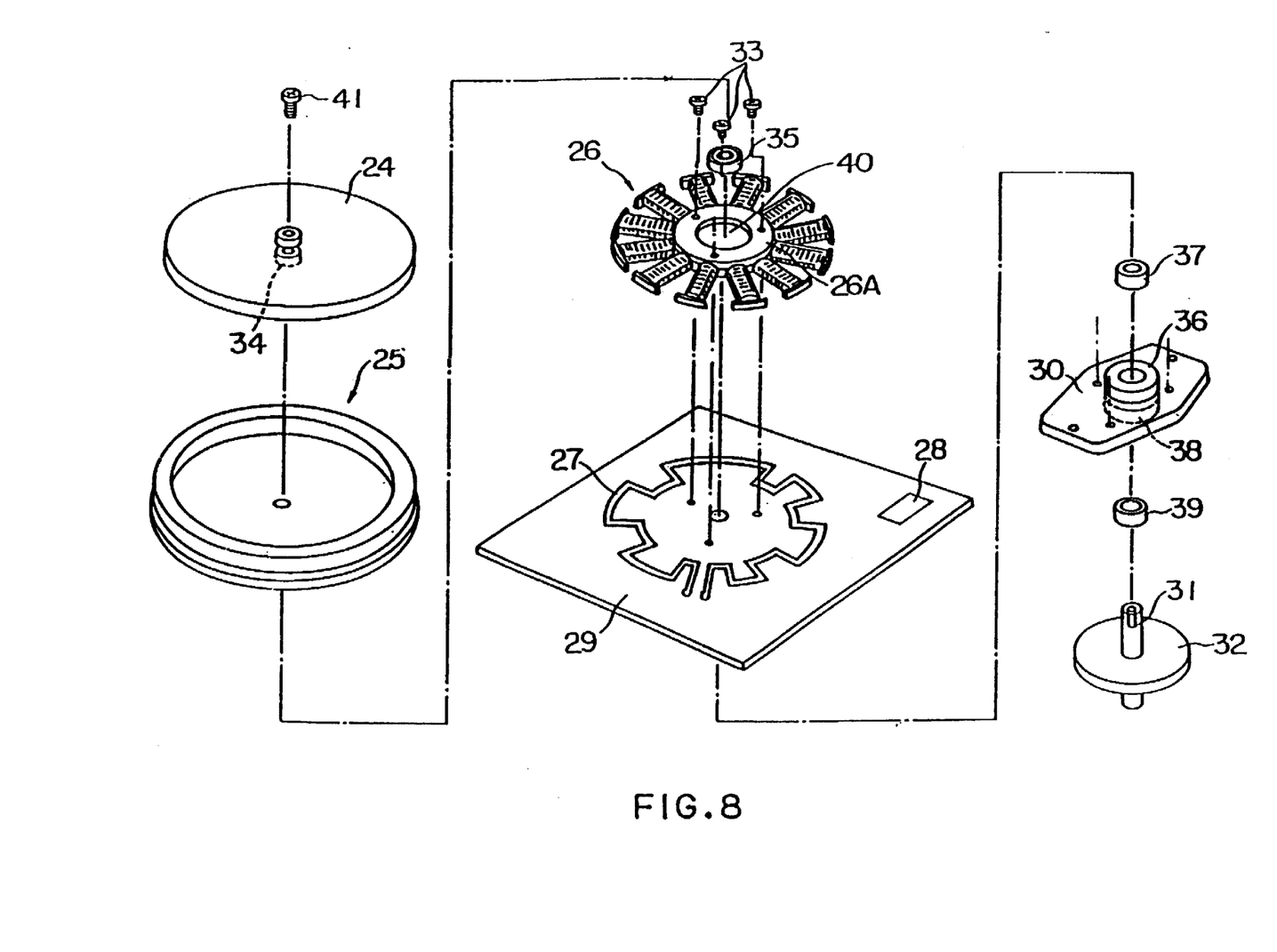
FIG. 8 is an exploded perspective view of a pulse generator according to a second embodiment of the present invention.

The pulse generator comprises a rotor cover 24, a rotor assembly (a rotor magnet) 25 coaxially fixed thereto by appropriate fixing means and used as a motor and pulse generation means, a motor stator assembly 26 disposed inside, the rotor assembly 25, an electronic circuit substrate 29 on which a printed coil 27 for the pulse generator is formed and on which a motor driving IC 28 is mounted (the IC being shown simply as a block because it is known in the art), a housing 30 having basically the same structure as that of the first embodiment, and a disk-shaped coupling 32 having a rotary shaft 31 and performing the same function as that of the first embodiment.

The motor stator assembly 26 is fixed to the electronic circuit substrate 29 by means of fixing bolts 33. The rotor cover 24 and the rotor assembly 25 are fastened by means of a bolt 41 to the rotary shaft 31 of the coupling 32 in a state in which the rotary shaft 31 is received in a boss portion 34 formed on the lower surface of the rotor cover 24. The rotary shaft 31 is rotatably held in ball bearings 37 and 39. The electronic circuit substrate 29 is fixed to the lower surface of the housing 30 as well as the stator assembly 26 by means of the fastening bolts 33.

Figure 10:
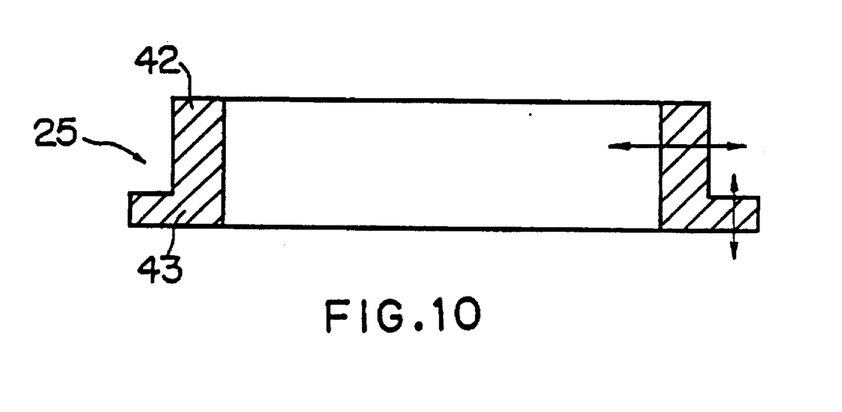
FIG. 10 is an axial cross section of the rotor assembly of FIG. 9.

As shown in FIG. 10, the rotor assembly 25 includes an upper rotor magnet 42 for driving the motor and having a magnetized face directed radially, and a lower rotor magnet 43 for generating pulses and having a magnetized face directed axially. This enables the magnetic poles M to be compactly assembled in a flat state in an end portion of the motor, without increasing the number of parts forming the magnetic poles M. In addition, it is preferred that the radial width of the magnetic poles for the pulse generator be smaller than the length of coil elements.

Figure 9:
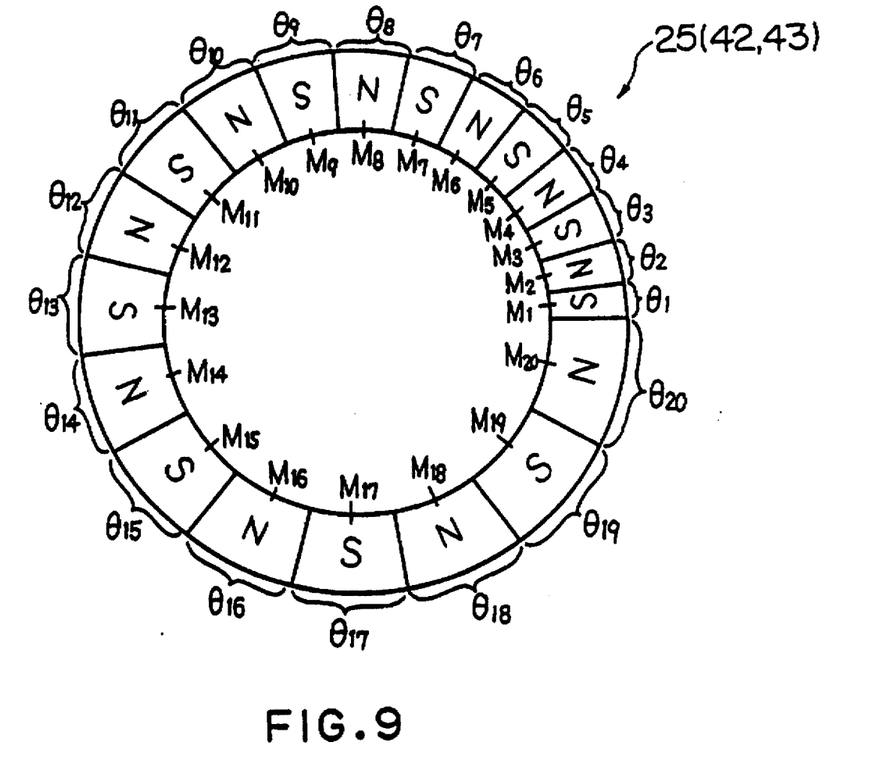
FIG. 9 is a plan view of the rotor magnets of a pulse generator as shown in FIG. 10 in a magnetized state.

As shown in FIG. 9, the motor driving rotor magnet 42 and the pulse generating rotor magnet 43 of the rotor assembly 25 have N- and S-poles arranged alternately in a circumferential direction. The index angles of the magnetic poles for driving the motor are made to be equal to each other, while the index angles of the magnetic poles for generating pulses are made to be unequal to each other. In this embodiment, the magnetic poles for generating pulses are formed so that their pitches are arranged to satisfy an arithmetic progression starting from the angle reference line 19 and proceeding in a counterclockwise direction and having the first term $\beta°$ and the common difference $\delta°$, as in the case of the first embodiment. When the number of magnetic poles is twenty, the first term $\beta°$ and the common difference $\delta°$ are selected to be respectively $8°$ and $1.05°$, for example. The magnetic poles M are arranged so that the odd-numbered magnetic poles are S-poles and the even-numbered magnetic poles are N-poles, for example. Moreover, the magnetic poles for driving the motor are arranged equidistantly from each other, through this arrangement is not shown in the drawings. It should be noted, however, the magnetic poles for generating pulses can be arranged in a different way from an arithmetic profession, as long as they are arranged unequal to each other.

Figure 11:
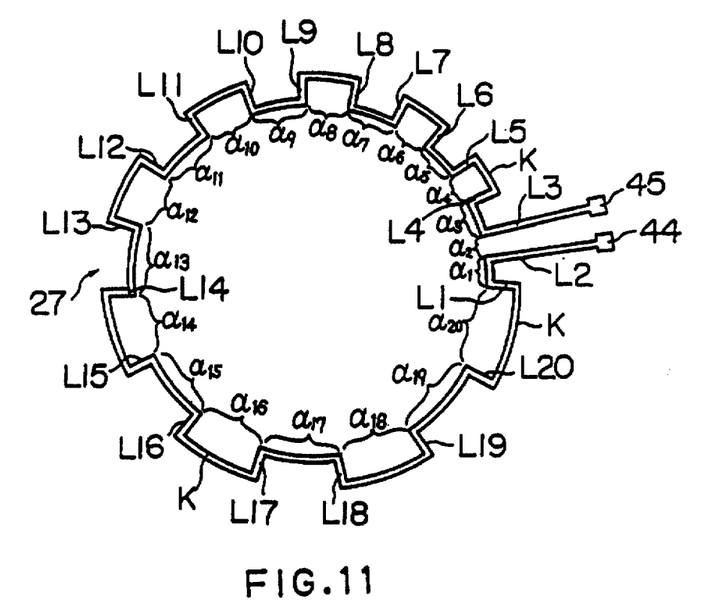
FIG. 11 is a plan view of the stator assembly of the pulse generator shown in FIG. 8.

The motor stator assembly 26 includes a disc-like central portion 26A having a central hole 40 formed therein, stator projections P which extend radially outward from the outer periphery of the central portion 26A and whose distal ends are provided with circumferentially extending stator salient poles T, and motor stator coils wound around the stator projections P. The number of stator projections P is twelve in this embodiment.

FIG. 11 shows one embodiment of the printed coil 27 which is formed on the electronic circuit substrate 29 and which is a kind of a pulse generating coil. The printed coil 27 comprises radially extending EMF generating wire elements L1 to L20 and connection wire elements K which connect the just adjacent elements L1 to L20 in a zigzag shape. The EMF generating wire elements L1 to L20 induce effective voltages due to electromagnetic interaction with the rotor magnets 43, and are numbered in a counterclockwise turn. Moreover, the second and third wire elements L2 and L3 are connected respectively to an input terminal 44 and an output terminal 45 which serve as a leading portion. The pitches between adjacent connection wires are selected to be equal to the pitches $\alpha1, \alpha2, \ldots, \alpha20$ between the adjacent stator salient poles T. In other words, the pitches are equal to the index angles $\theta1, \theta2, \ldots, \theta20$ of the rotor magnet 43 used in the second embodiment in order to generate pulses, respectively.

Figure 12:
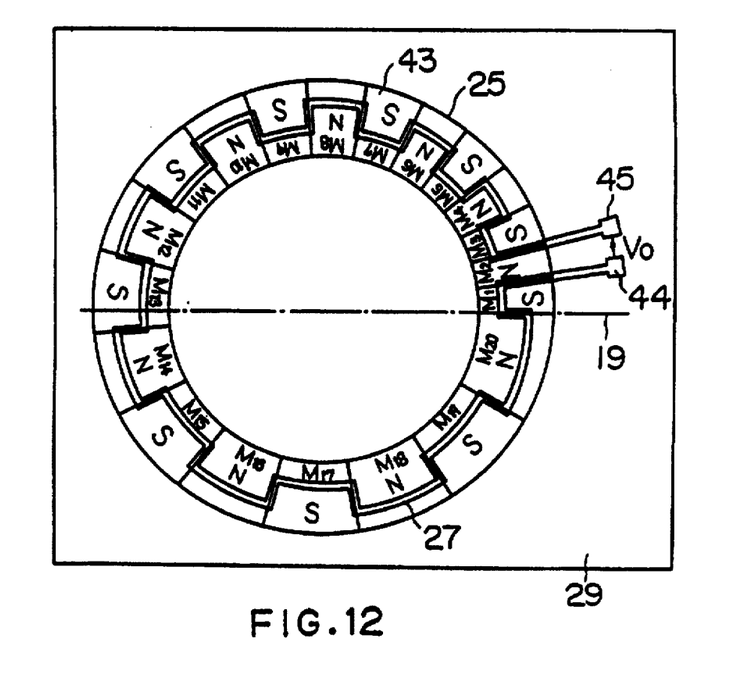
FIG. 12 is a plan view of the pulse generator of FIG. 8 when the rotor assembly exactly magnetically matches the stator assembly.
Figure 13:
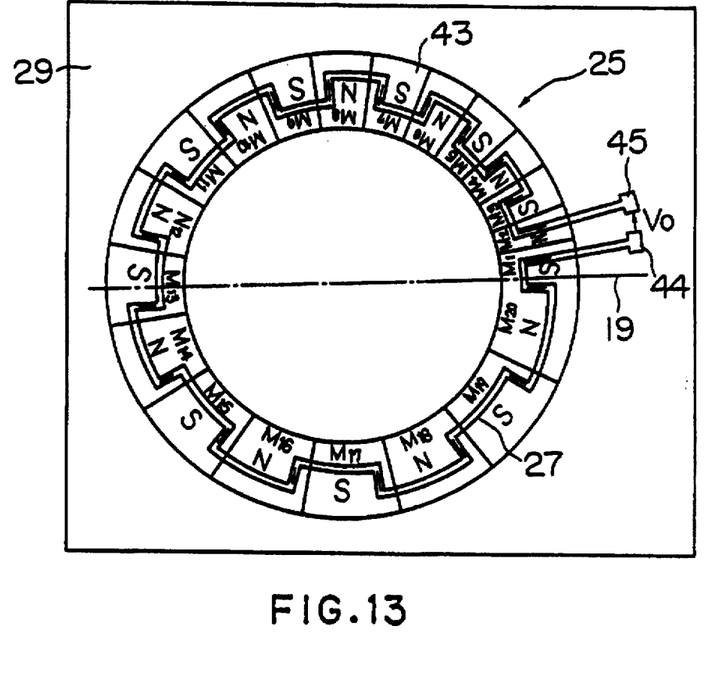
FIG. 13 is a plan view of the pulse generator of FIG. 8 at the time when the maximum positive total generated EMF output is obtained and which is earlier by a very short period than the time when the rotor assembly and the stator assembly have the positional relationship as shown in FIG. 9.
Figure 14:
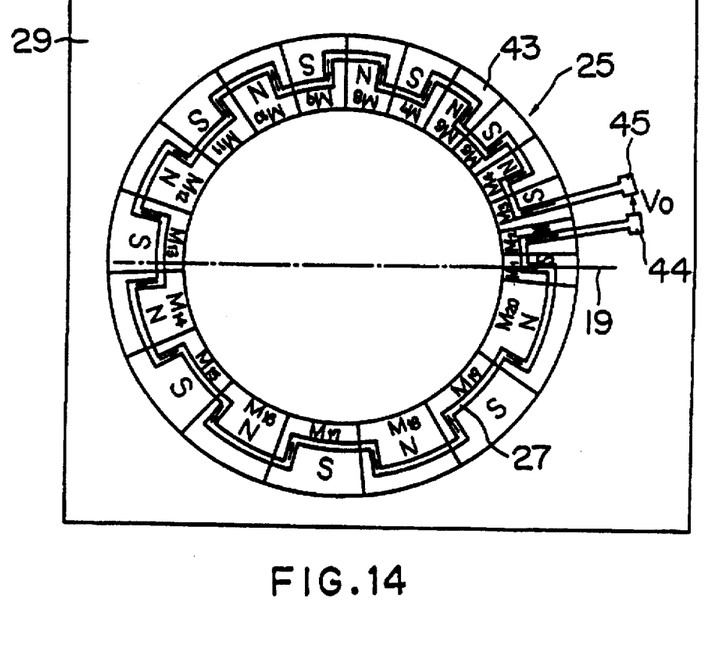
FIG. 14 is a plan view of the pulse generator of FIG. 8 at the time when the maximum negative total generated EMF output is obtained and which is later by a very short period than the time when the rotor assembly and the stator assembly have the positional relationship as shown in FIG. 4.

The rotor assembly 25 of the second embodiment is adopted to rotate clockwise in FIGS. 12 to 14, and the pulse generating rotor magnet 43 is coaxially arranged in a face-to-face manner on the printed coil 27. FIG. 12 shows the state in which the clockwise side faces of the magnetic poles M1 to M20 of the pulse generating rotor magnet 43 in the rotor assembly 25 are aligned with the centers of the EMF generating wire elements L1 to L20. This state corresponds to that shown in FIG. 4 relating to the first embodiment. FIGS. 13 and 14 respectively show the positional relationship between the centers of the EMF generating wire elements L1 to L20 and of the pulse generating rotor magnet 43 of the rotor assembly 25 at time $t=t0-\Delta1$ and time $t=t0+\Delta2$ ($\Delta1$ and $\Delta2$ indicate very short positive time periods such as milliseconds), provided that the state shown in FIG. 12 is attained at time $t=t0$. Further, FIG. 15 shows the time—total generated EMF output characteristic of the pulse generator.

Figure 15:
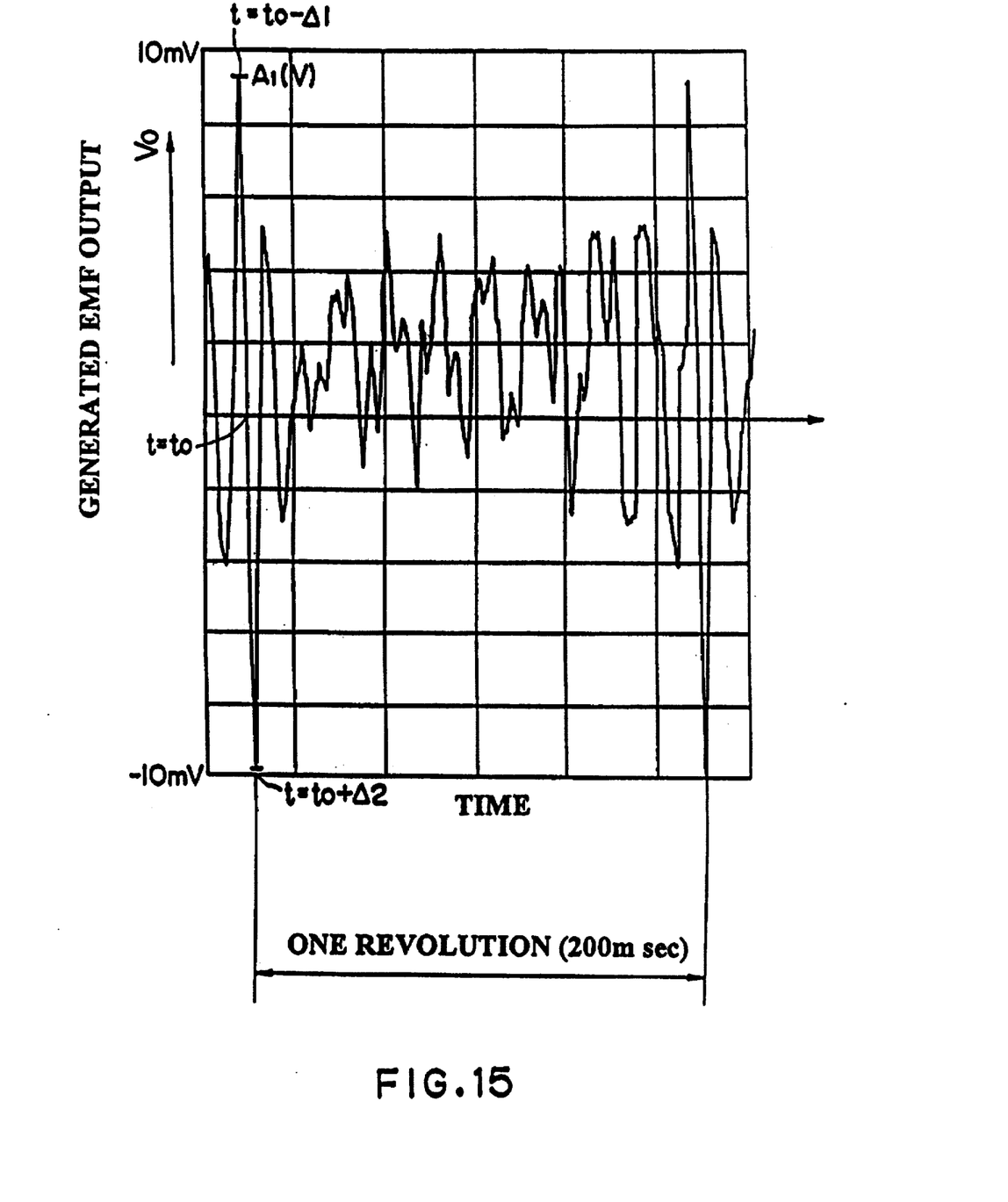
FIG. 15 is a graph showing the time—total generated EMF output characteristic of the pulse generator as shown in FIG. 8.

As shown in FIG. 15, the total generated EMF output (total induced electromotive force) VO has the maximum positive value at time $t=t0-\Delta1$, and has the maximum negative value at time $t=t0+\Delta2$. A pulse is detected at time $t=t0$ when the total generated EMF output (total induced electromotive force), which is the added result of the maximum positive and negative total generated EMF outputs, becomes zero. In the latest electric or electronic waveform processing techniques, it is considerably easy to accurately determine time $t=t0$ when the total generated EMF output is zero during a shift from the maximum positive value to the maximum negative value, or from the maximum negative value to the maximum positive value. The second embodiment can also achieve the accurate detection of the rotating position of the to-be-detected rotary object.

Figure 16:
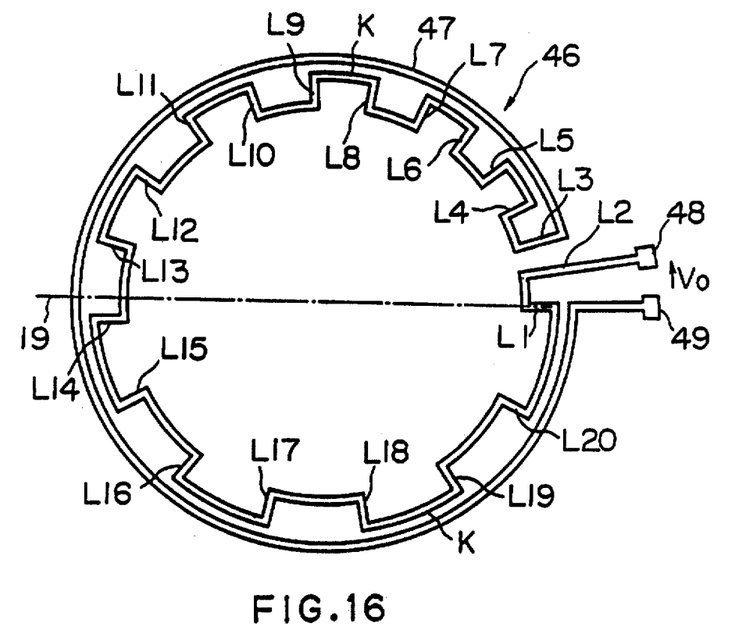
FIG. 16 is a plan view of the printed coil used in a pulse generator of a third embodiment of the present invention.

FIG. 16 shows the third embodiment of the present invention in which the rotor magnet is used both for generating pulses and for controlling the motor, as in the case of the second embodiment. The pitches of the pulse generating rotor magnet are unequal to each other as in the first and second embodiments. A printed coil 46 comprises EMF generating wire elements L1 to L20 arranged circularly in a counterclockwise direction, and connection wire elements K connecting the pairs of adjacent wire elements L1 and L2, L3 to L20 and L20 and L1 except that the wire elements L2 and L4 are not connected together. A circular return coil 47 closely surrounds the printed coil 46 in order to reduce the space between the printed coil 46 and the circular return coil 47, and has one end connected to the first wire element L1. The first EMF generating wire element L1 and the other end of the return coil 47 are respectively coupled to an output terminal 48 and an input terminal 49 which serve as a leading-out portion.

When a rotor magnet is used both for generating pulses and for controlling a motor, there is the possibility that leaking magnetic fluxes from the motor-controlling rotor magnet may coincide with the printed coil, lowering the S/N ratio of the total generated EMF output. However, by the use of the return coil 47, the S/N ratio of the total generated EMF output can be prevented from being lowered.

Figure 17:
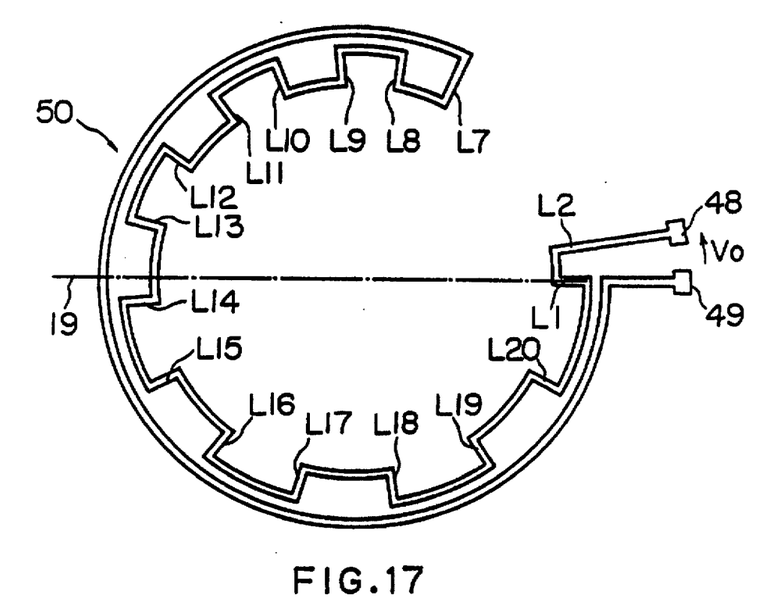
FIG. 17 is a plan view of the printed coil used in a pulse generator of a fourth embodiment of the present invention.

FIG. 17 shows the fourth embodiment of the present invention. A printed coil 50 is similar to the printed coil 46 of the third embodiment, except that the third to sixth generating wire elements (corresponding to L1 to L6 shown in FIG. 16) have been removed from the printed coil 46. The number of generating wire elements is smaller than that of the third and fourth embodiments, and therefore the total generated EMF output is lowered to such an extent accordingly. On the other hand, there is an advantage in that a space formed as a result of the removal of these EMF generating wire elements allows a motor driving pattern (for example, a line for supplying power to a motor coil) to be formed in the space within the printed coil 50. In consideration of design and performance, it is determined which of the generating wire elements is to be removed. However, the number of generating wire elements to be removed needs be minimized in order to prevent the S/N ratio of the total generated EMF output from being lowered below the required value. To this end, those of the generating wire elements which have large pitches may be removed.

Figure 18:
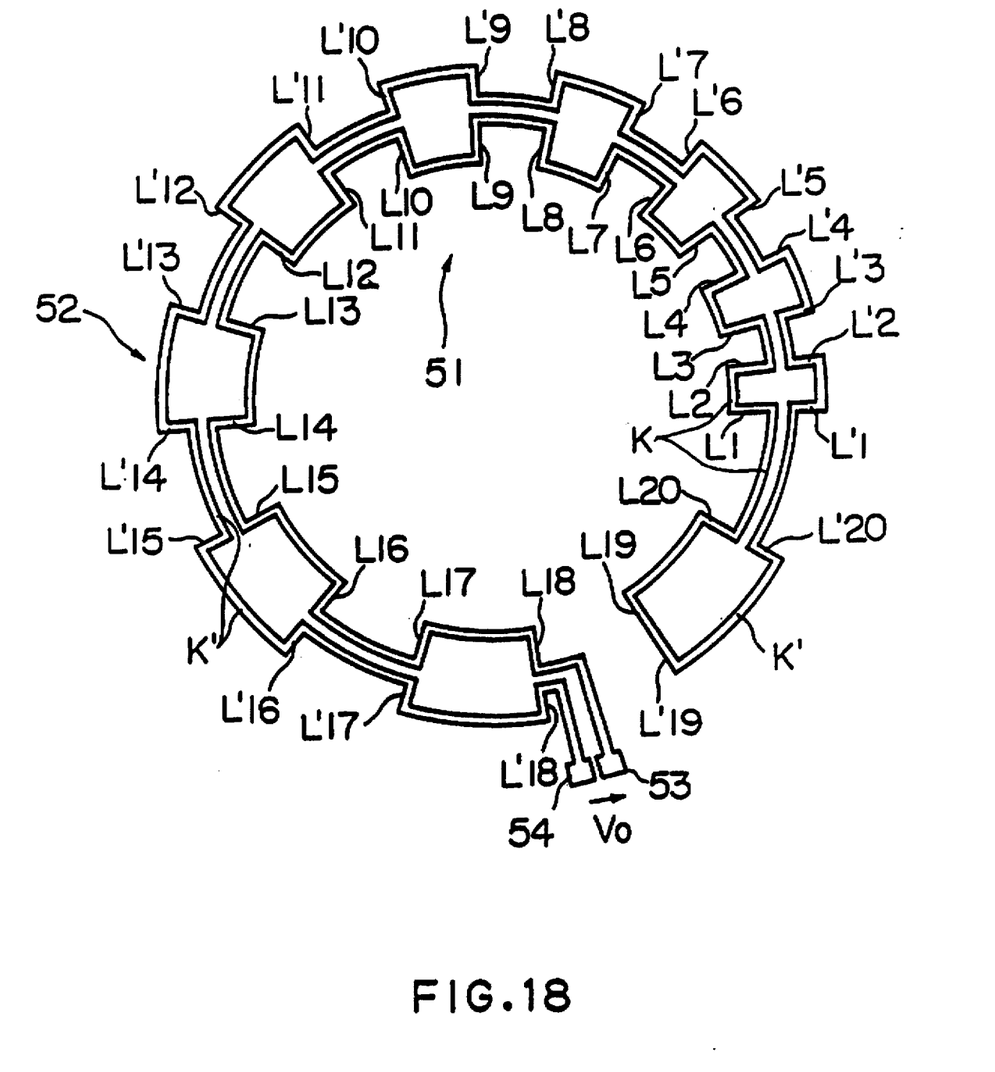
FIG. 18 is a plan view of the printed coils used in a fifth embodiment of the present invention.

FIG. 18 shows the fifth embodiment of the present invention. This embodiment employs a zigzag-patterned printed coil 51 and anther zigzag-patterned printed coil 52 surrounding the coil 51. The printed coil 51 comprises EMF generating wire elements L1 to L20 extending radially and inwardly and the connection wire elements K arranged circularly and connecting the corresponding ends of pairs of the adjacent EMF generating wire elements L1 to L18 and L19 and L20 with the elements L18 and L19 disconnected. The printed coil 52 comprises EMF generating wire elements L'1 to L'20 extending radially and outwardly so as to align with the EMF generating wire elements L1 to L20 of the printed coil 51, and connection wire elements K' connecting the corresponding ends of pairs of the adjacent EMF generating wire elements L'1 to L'18 and L'20 and L'1 with the elements L'18 and L'19 disconnected. In this embodiment, the clockwise side ends of both of the printed coils 51 and 52 are connected to the outer and inner ends of the elements L19 and L'19, respectively, and the counterclockwise side ends of the printed coils 51 and 52 are coupled to an output terminal 53 and an input terminal 54 which serve as a leading-out portion. However, other coupling methods can be used, if desired. This embodiment has an advantage in that the S/N ratio of the total generated EMF output is not lowered even if no return coil is used.

In the second embodiment and the subsequent embodiments, the printed coils are used. Although they are not wound around cores but are patterned, they are considered to be coils. When using the printed coils, therefore, the whole pulse generator can be formed flat so that it can be easily assembled into the rotary object (which is a motor in most cases) to be indexed. Moreover, since no cores are used, cogging torque is small. This permits the angular position of a rotary body to be detected with high accuracy. The patterns of the printed coils are not limited to those of the second embodiment and the subsequent embodiments, and may have a magnetically matching structure which allows the index angles of the magnetic poles of a rotor magnet to magnetically match the pitches of their corresponding coils only once per revolution of a rotor or a rotor assembly.

The explanation of the embodiments according to the present invention has been made to the outer rotor type pulse generator. However, the present application is applicable to an inner rotor type pulse generator.

The pulse generator of the present invention has an advantage in that an accurate index signal can be obtained only at one position per revolution by setting the pitches between the coils of the stators to unequal values and by selecting the index coil pitches. Moreover, the pulse generator of the present invention has an advantage in that it can be manufactured at low cost because an expensive magnetoelectric converter such as a Hall sensor is not used. Further, the pulse generator of the present invention has an advantage in that it is applicable in a wide temperature range since it has an excellent temperature characteristic, and has another advantage in that it withstands electric and mechanical stresses and can be used under severe environments.

What is claimed is:

1. A pulse generator comprising a rotor assembly having a center and a stator assembly disposed coaxial with said rotor assembly, said rotor assembly comprising a permanent magnet which comprises a plurality of magnetic poles arranged circularly at said center of said stator assembly, each pair of the adjacent magnetic poles bearing magnetic polarities opposite to each other, each of said magnetic poles having two ends which define an index angle at said center of said stator assembly, said stator assembly comprising a plurality of stator coils arranged circularly in total at said center of said rotor assembly and each of said stator coil being directed toward said permanent magnet, a gap between each pair of the adjacent stator coils defining a pitch, wherein said index angles are set to be unequal to each other, and said pitches are set to allow said stator coils to electromagnetically match the corresponding magnetic poles only once per revolution of said rotor assembly.

2. The pulse generator according to claim 1, wherein said magnetic poles are arranged in such a way that said index angles form an arithmetic progression.

3. The pulse generator according to claim 2, wherein said arithmetic progression is given as $\{2\beta°+(n-1)\delta°\}n/2=360°$ or $\{2\beta°+(n-1)\delta°\}n/2=360°$ where $\beta°$ and $\delta$ represent a first term and a common difference of said arithmetic progression, respectively, and where n indicates the number of magnetic poles.

4. The pulse generator according to claim 2, wherein said arithmetic progression is given as $360°-\delta/2 < \{2\beta°+(n-1)\delta°\}n/2 < 360°+\delta°/2$ where $\beta°$ and $\delta°$ represent a first term and a common difference of said arithmetic progression, respectively, and where n indicates the number of magnetic poles.

5. The pulse generator according to claim 2, wherein said common difference of said arithmetic progression is 0.1° to 1.5°.

6. The pulse generator according to claim 1, wherein said stator coils form a printed coil.

7. The pulse generator according to claim 6, wherein said printed coil comprises electromotive force generating wire elements and the number of said electromotive force generating wire elements is equal to the number of said magnetic poles.

8. The pulse generator according to claim 7, wherein at least one of the electromotive force generating wire elements is removed.

9. The pulse generator according to claim 6, wherein there is further provided an output terminal, and said printed coil includes a circular return coil having one end connected to said output terminal.

10. The pulse generator according to claim 6, wherein said printed coil is zigzag-shaped.

11. The pulse generator according to claim 6, wherein said rotor assembly further comprises a first magnet for generating pulses and a second magnet for driving a motor, said second magnet being integrally formed on said first magnet in a superposed manner.

* * * * *